(12) United States Patent
Chen

(10) Patent No.: US 11,804,381 B2
(45) Date of Patent: Oct. 31, 2023

(54) CONDUCTIVE WIRE STRUCTURE

(71) Applicant: Winbond Electronics Corp., Taichung (TW)

(72) Inventor: Huang-Nan Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 99 days.

(21) Appl. No.: 17/707,968

(22) Filed: Mar. 30, 2022

(65) Prior Publication Data

US 2022/0223432 A1 Jul. 14, 2022

Related U.S. Application Data

(62) Division of application No. 16/903,382, filed on Jun. 17, 2020, now Pat. No. 11,335,569.

(51) Int. Cl.
| | |
|---|---|
| *H01L 21/3213* | (2006.01) |
| *H01L 23/528* | (2006.01) |
| *H01L 21/033* | (2006.01) |
| *H01L 21/768* | (2006.01) |
| *H01L 23/522* | (2006.01) |

(52) U.S. Cl.
CPC .... *H01L 21/32139* (2013.01); *H01L 21/0337* (2013.01); *H01L 23/528* (2013.01); *H01L 21/76885* (2013.01); *H01L 23/5226* (2013.01); *H01L 23/5283* (2013.01)

(58) Field of Classification Search
CPC .......... H01L 21/32139; H01L 21/0337; H01L 23/528; H01L 23/5226; H01L 23/5283; H01L 21/76885

USPC ........................... 257/773; 430/312; 438/703
See application file for complete search history.

(56) References Cited

U.S. PATENT DOCUMENTS

| | | | |
|---|---|---|---|
| 11,335,569 B2 * | 5/2022 | Chen | .................. H01L 23/5283 |
| 2014/0080069 A1 | 3/2014 | Yang | |
| 2019/0318989 A1 | 10/2019 | Shao et al. | |

FOREIGN PATENT DOCUMENTS

| | | |
|---|---|---|
| CN | 204407323 | 6/2015 |
| JP | 2002064043 | 2/2002 |

OTHER PUBLICATIONS

"Office Action of China Counterpart Application", dated May 10, 2023, p. 1-p. 6.

* cited by examiner

*Primary Examiner* — Caleen O Sullivan
(74) *Attorney, Agent, or Firm* — JCIPRNET

(57) ABSTRACT

A conductive wire structure including a first conductive wire and a second conductive wire is provided. The second conductive wire is located on one side of the first conductive wire. The first conductive wire includes a first conductive wire portion and a first pad portion. The first conductive wire portion extends in a first direction and has a first end and a second end. The first pad portion is connected to the first end of the first conductive wire portion. The second conductive wire includes a second conductive wire portion and a second pad portion. The second conductive wire portion extends in a second direction and has a third end and a fourth end. The third end is adjacent to the first end, and the fourth end is adjacent to the second end. The second pad portion is connected to the fourth end of the second conductive wire portion.

16 Claims, 12 Drawing Sheets

CONDUCTIVE WIRE STRUCTURE

CROSS-REFERENCE TO RELATED APPLICATION

This application is a divisional application of and claims the priority benefit of U.S. application Ser. No. 16/903,382, filed on Jun. 17, 2020. The entirety of the above-mentioned patent application is hereby incorporated by reference herein and made a part of this specification.

BACKGROUND OF THE INVENTION

Field of the Invention

The invention relates to a semiconductor device and a manufacturing method thereof, and particularly relates to a conductive wire structure and a manufacturing method thereof.

Description of Related Art

With the advancement of semiconductor technology, the size of device has also continued to shrink. As the integrity of the integrated circuit increases, the critical dimension of the conductive wire and the distance between the conductive wires will decrease accordingly. When the critical dimension of the conductive wire is reduced, it will make it difficult to align the subsequently formed contact with the conductive wire, thereby reducing the alignment margin between the contact and the conductive wire. In addition, when the distance between the conductive wires is shortened, the contact is easily connected to two adjacent conductive wires simultaneously to cause the problem of short circuit.

SUMMARY OF THE INVENTION

The invention provides a conductive wire structure and a manufacturing method thereof, which can increase the alignment margin between the contact and the conductive wire, and can prevent the problem of short circuit between two adjacent conductive wires.

The invention provides a method of manufacturing a conductive wire structure, which includes the following steps. A substrate is provided. A conductive layer is formed on a substrate. A rectangular ring spacer is formed on the conductive layer by a self-aligned double patterning (SADP) process. A patterned photoresist layer is formed. The patterned photoresist layer exposes a first portion and a second portion of the rectangular ring spacer. The first portion and the second portion are located at two corners on a diagonal of the rectangular ring spacer. The first portion and the second portion are removed by using the patterned photoresist layer as a mask to form a first spacer and a second spacer. The first spacer and the second spacer are L-shaped. The patterned photoresist layer is removed. A pattern of the first spacer and a pattern of the second spacer are transferred to the conductive layer to form an L-shaped first conductive wire and an L-shaped second conductive wire.

The invention provides a conductive wire structure, which includes a first conductive wire and a second conductive wire. The second conductive wire is located on one side of the first conductive wire. The first conductive wire includes a first conductive wire portion and a first pad portion. The first conductive wire portion extends in a first direction and has a first end and a second end. The first pad portion is connected to the first end of the first conductive wire portion. The second conductive wire includes a second conductive wire portion and a second pad portion. The second conductive wire portion extends in a second direction and has a third end and a fourth end. The third end is adjacent to the first end, and the fourth end is adjacent to the second end. The second direction is an opposite direction of the first direction. The second pad portion is connected to the fourth end of the second conductive wire portion. A first imaginary extension portion extends from the second end of the first conductive wire portion in the first direction away from the first end of the first conductive wire portion. A second imaginary extension portion extends from the third end of the second conductive wire portion in the second direction away from the fourth end of the second conductive wire portion. The first pad portion extends toward the second imaginary extension portion but does not intersect the second imaginary extension portion. The second pad portion extends toward the first imaginary extension portion but does not intersect the first imaginary extension portion.

Based on the above description, in the manufacturing method of the conductive wire structure according to the invention, the L-shaped first conductive wire and the L-shaped second conductive wire are formed by the self-aligned double patterning process, the patterning process, and the pattern transfer process, so that the process can be effectively simplified to reduce the complexity of the process. In addition, the L-shaped first conductive wire and the L-shaped second conductive wire manufactured by the above method can increase the area for electrically connecting with the subsequently formed contact, so that the alignment margin between the contact and the first conductive wire and the alignment margin between the contact and the second conductive wire can be effectively increased. Furthermore, the distance between the first conductive wire and the second conductive wire can be flexibly adjusted by the above method, thereby preventing the problem of short circuit caused by the contact simultaneously connected to the first conductive wire and the second conductive wire.

Moreover, in the conductive wire structure according to the invention, since the first conductive wire and the second conductive wire respectively have a first pad portion and a second pad portion, the alignment margin between the contact and the first conductive wire and the alignment margin between the contact and the second conductive wire can be effectively increased. In addition, since the first pad portion extends toward the second imaginary extension portion but does not intersect the second imaginary extension portion, and the second pad portion extends toward the first imaginary extension portion but does not intersect the first imaginary extension portion, the problem of short circuit caused by the contact being simultaneously connected to the first conductive wire and the second conductive wire can be prevented.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
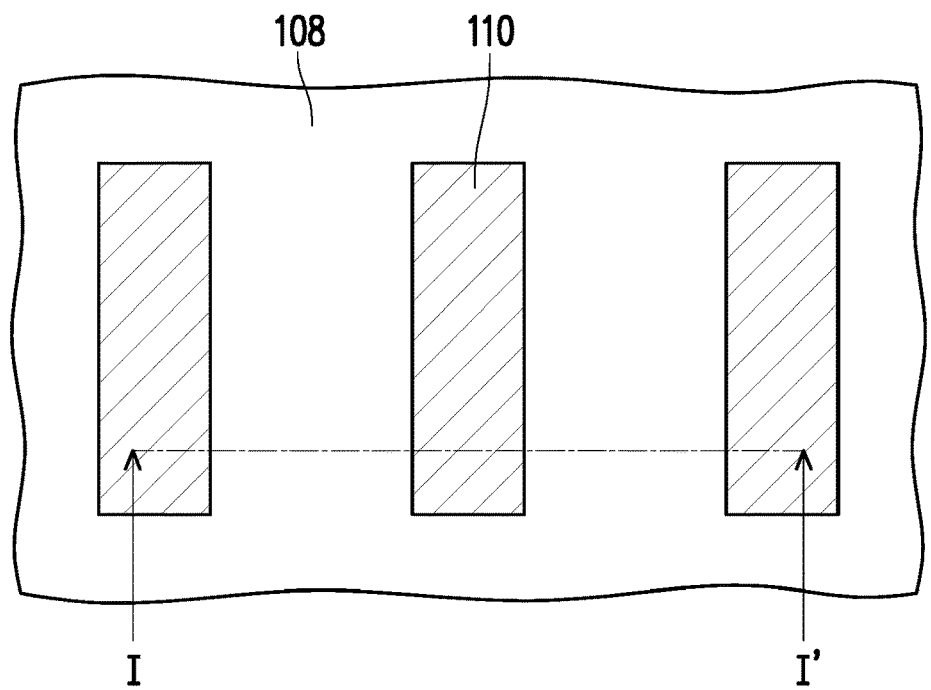
FIG. 1A to FIG. 1G are top views illustrating a manufacturing process of a conductive wire structure according to an embodiment of the invention.
Figure 2A:
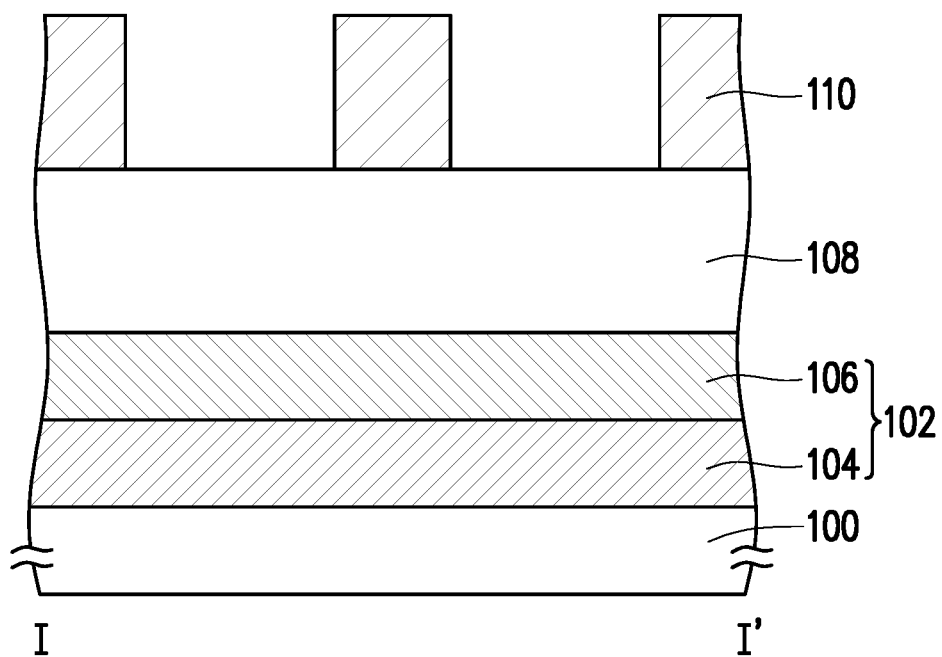
FIG. 2A to FIG. 2I are cross-sectional views taken along a section line I-I' and a section line II-II' in FIG. 1A to FIG. 1I.

Referring to FIG. 1A and FIG. 2A, a substrate 100 is provided. The substrate 100 may be a semiconductor substrate, such as a silicon substrate. Furthermore, one of ordinary skill in the art may form a semiconductor device (e.g., a transistor) (not shown) and a dielectric layer (not shown) on the substrate 100 according to product requirements, and the description thereof is omitted herein.

A conductive layer 102 is formed on the substrate 100. The conductive layer 102 may be a single-layer structure or a multi-layer structure. For example, the conductive layer 102 may be a multilayer structure including a conductive layer 104 and a conductive layer 106, but the invention is not limited thereto. The conductive layer 104 is, for example, doped polysilicon. The conductive layer 106 is, for example, a metal or metal compound, such as tungsten, tungsten nitride, aluminum, titanium nitride, or copper.

A hard mask layer 108 may be formed on the conductive layer 102. The hard mask layer 108 is, for example, silicon nitride or silicon oxide.

Referring to FIG. 1A to FIG. 1D and FIG. 2A to FIG. 2D, a rectangular ring spacer 112a (referring to FIGS. 1D and 2D) may be formed on the conductive layer 102 by a self-aligned double patterning (SADP) process. For example, the rectangular ring spacer 112a may be formed on the hard mask layer 108 by the self-aligned double patterning process, as described below.

Referring to FIG. 1A and FIG. 2A, a core pattern 110 having a rectangular shape may be formed on the conductive layer 102. The material of the core pattern 110 is, for example, carbon, polysilicon, silicon oxide, or silicon nitride. The core pattern 110 may be formed by a deposition process, a lithography process, and an etching process.

Figure 1B:
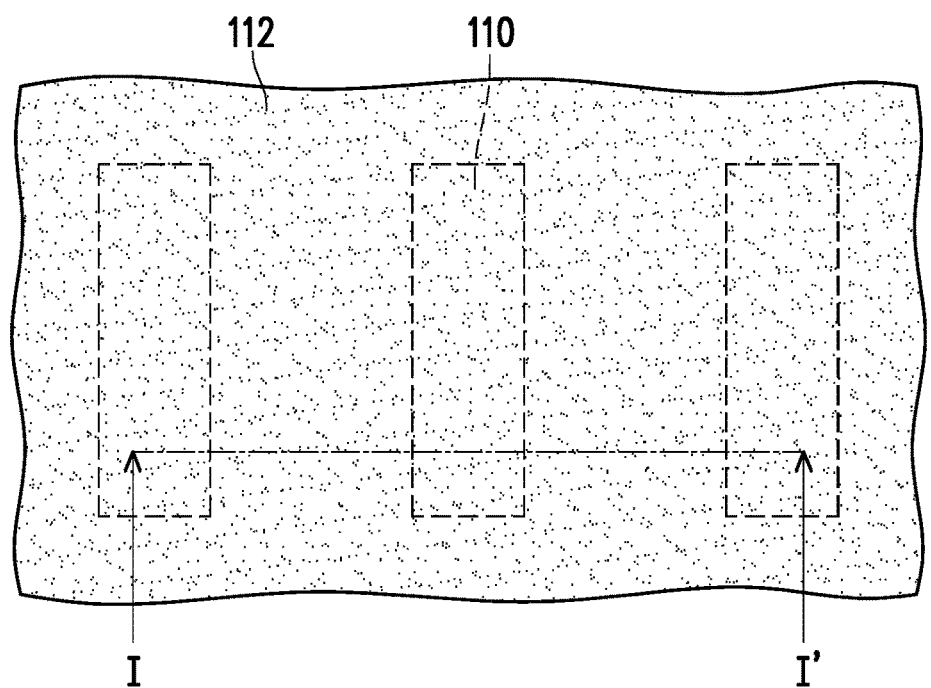
Figure 2B:
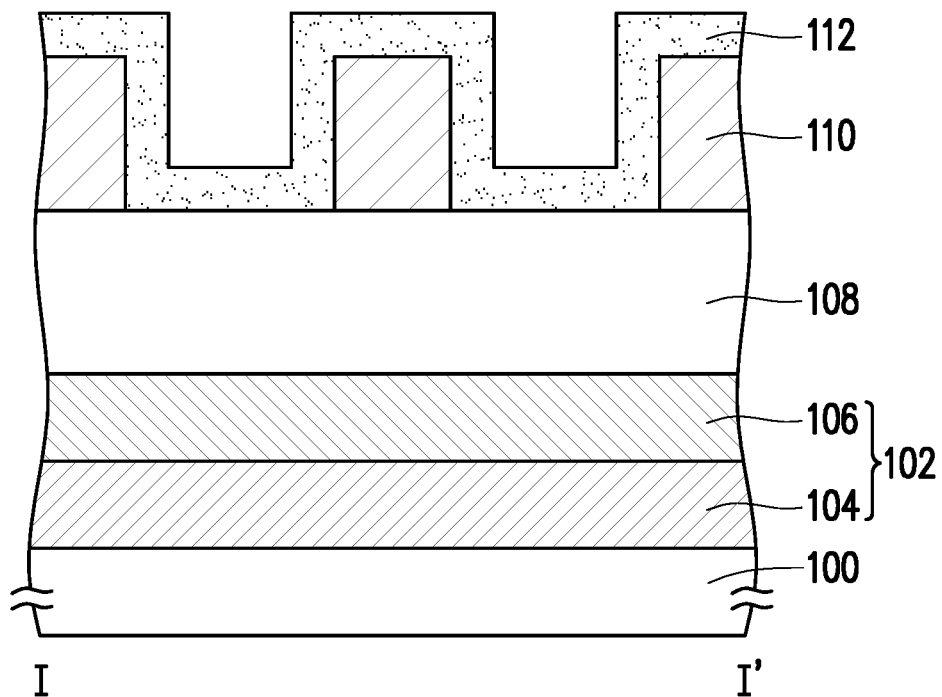

Referring to FIG. 1B and FIG. 2B, a spacer material layer 112 may be conformally formed on the core pattern 110. The material of the spacer material layer 112 is, for example, silicon oxide or silicon nitride. The method of forming the spacer material layer 112 is, for example, a chemical vapor deposition method or an atomic layer deposition method.

Figure 1C:
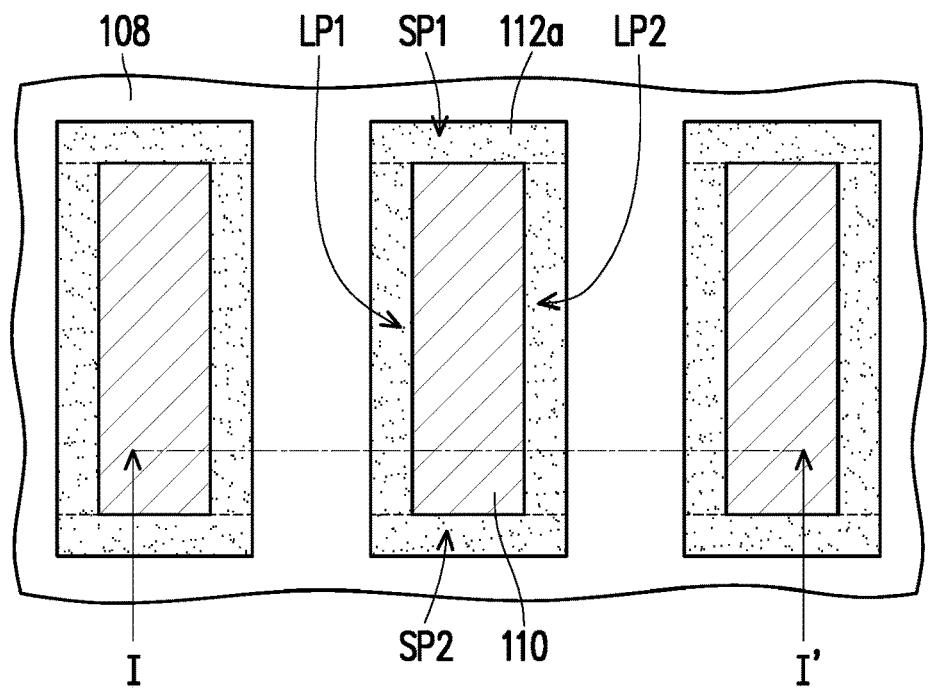
Figure 2C:
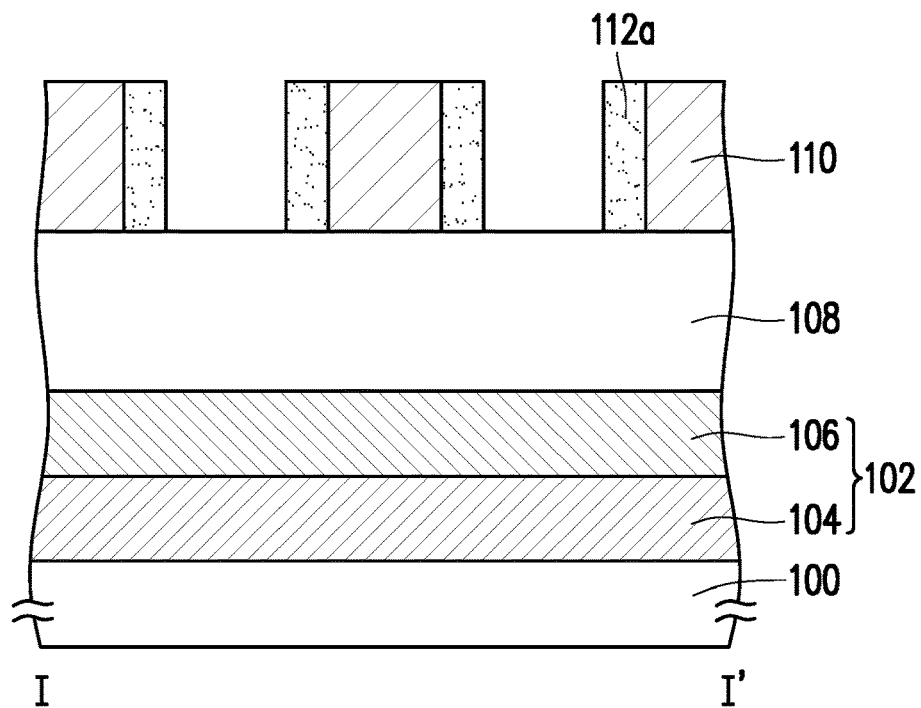

Referring to FIG. 1C and FIG. 2C, an etching process may be performed on the spacer material layer 112 to form a rectangular ring spacer 112a surrounding the sidewall of the core pattern 110. The rectangular ring spacer 112a may include a long side portion LP1, a long side portion LP2, a short side portion SP1, and a short side portion SP2. The short side portion SP1 is connected to an end of the long side portion LP1 and an end of the long side portion LP2. The short side portion SP2 is connected to the other end of the long side portion LP1 and the other end of the long side portion LP2. The etching process is, for example, a dry etching process.

Figure 1D:
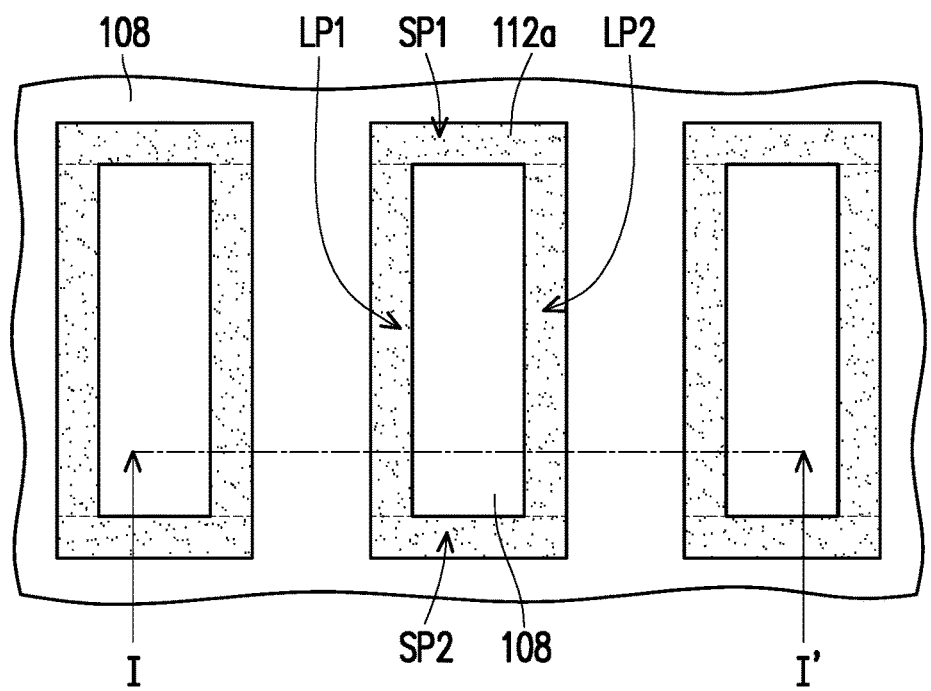
Figure 2D:
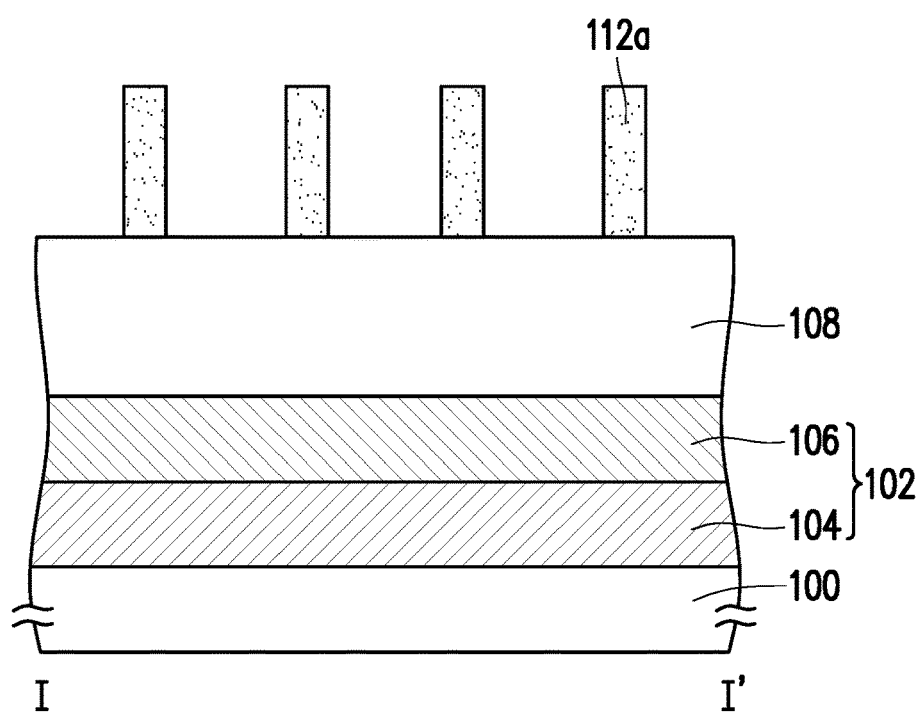

Referring to FIG. 1D and FIG. 2D, the core pattern 110 may be removed. When the material of the core pattern 110 is carbon, the method of removing the core pattern 110 is, for example, ashing. When the material of the core pattern 110 is polysilicon, silicon oxide, or silicon nitride, the method of removing the core pattern 110 is, for example, a wet etching method.

In addition, although the self-aligned double patterning process is described using the above method as an example, the invention is not limited thereto.

Figure 1E:
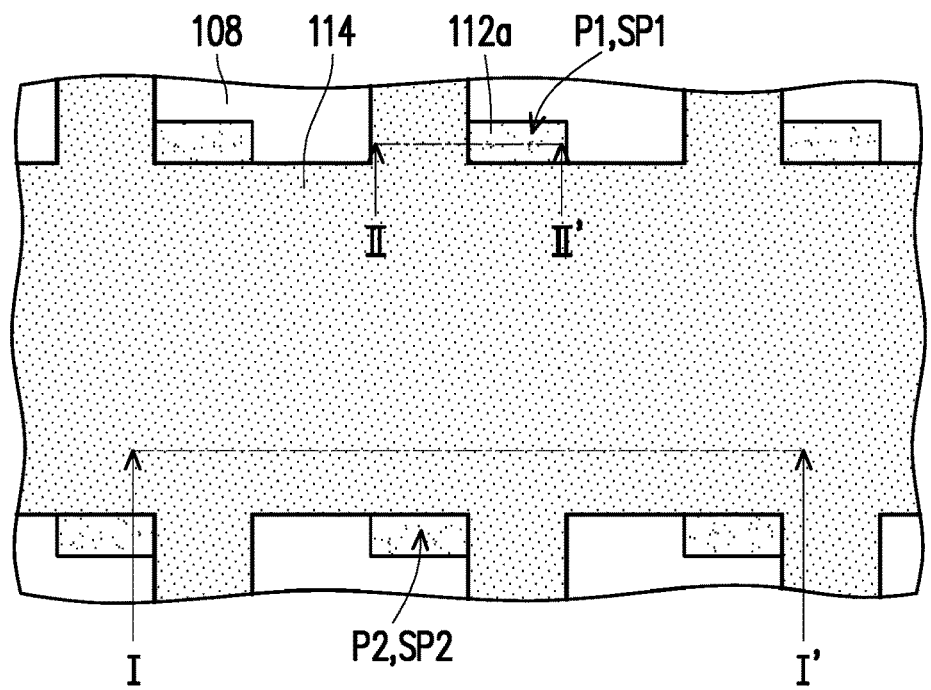
Figure 2E:
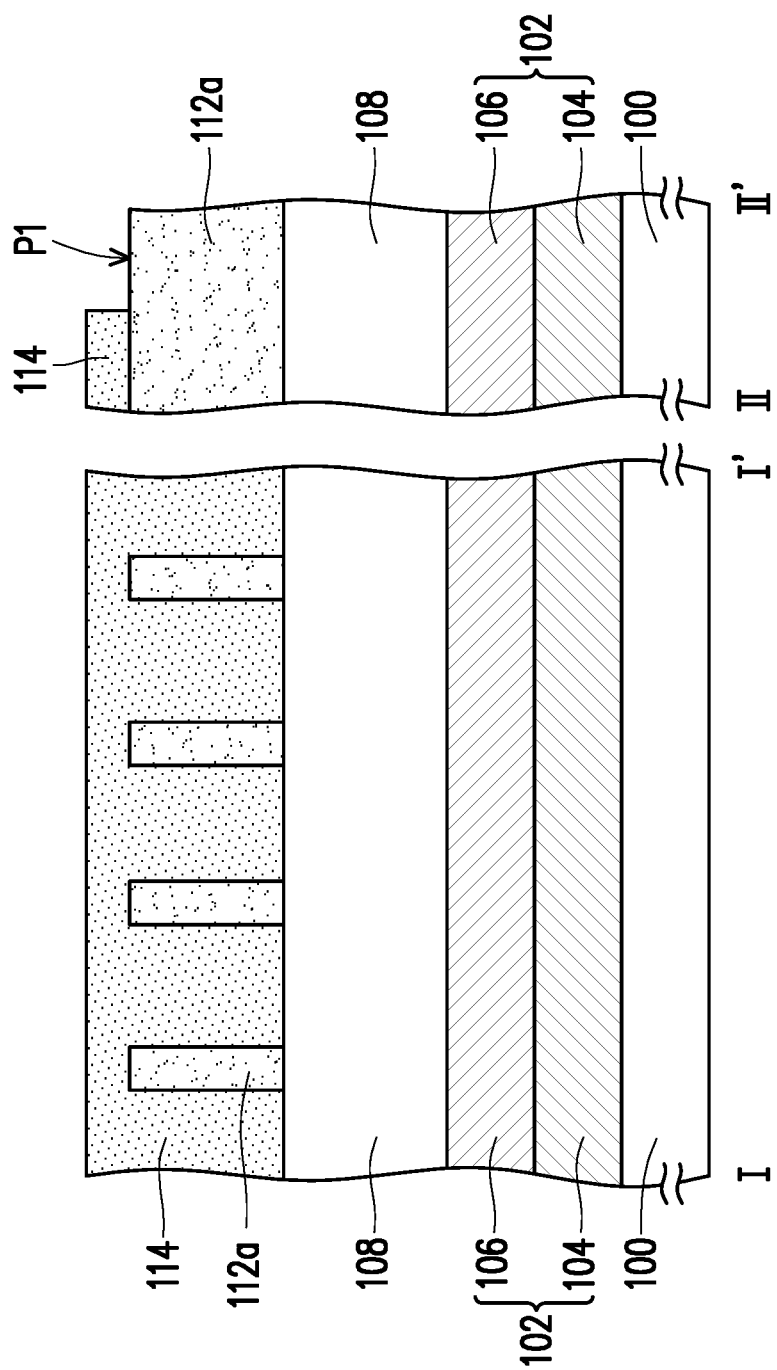

Referring to FIG. 1E and FIG. 2E, a patterned photoresist layer 114 is formed. The patterned photoresist layer 114 may be formed by a lithography process. The patterned photoresist layer 114 exposes a first portion P1 and a second portion P2 of the rectangular ring spacer 112a. The first portion P1 and the second portion P2 are located at two corners on the diagonal of the rectangular ring spacer 112a. The first portion P1 may include a portion of the short side portion SP1, and the second portion P2 may include a portion of the short side portion SP2. The length of the portion of the short side portion SP1 in the first portion P1 may be one-third to two-thirds of the total length of the short side portion SP1, and the length of the portion of the short side portion SP2 in the second portion P2 may be one-third to two-thirds of the total length of the short side portion SP2. That is, the patterned photoresist layer 114 may expose the portion of the short side portion SP1 and the portion of the short side portion SP2, but the invention is not limited thereto. In other embodiments, the first portion P1 may further include a portion of the long side portion LP1, and the second portion P2 may further include a portion of the long side portion LP2. That is, the patterned photoresist layer 114 may further expose the portion of the long side portion LP1 and the portion of the long side portion LP2.

Figure 1F:
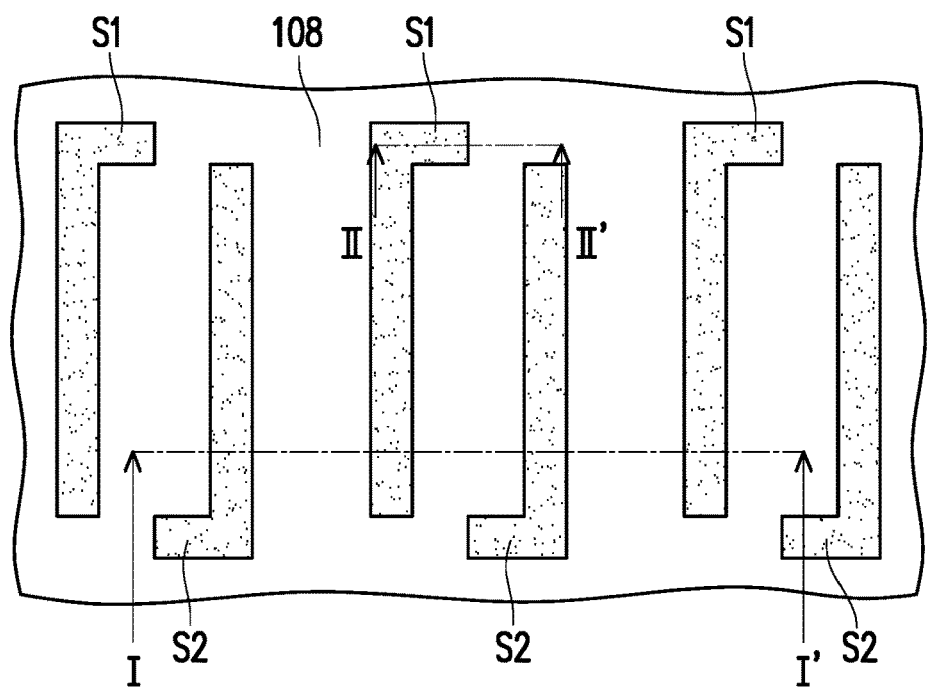
Figure 2F:
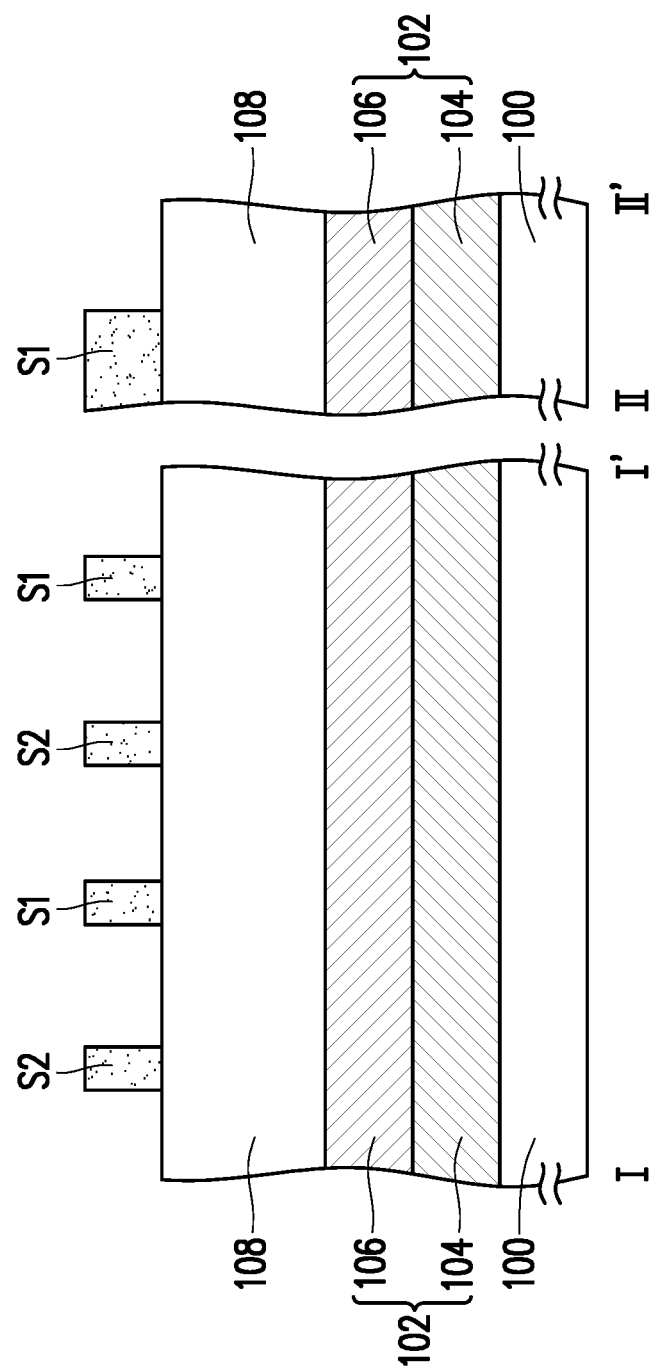

Referring to FIG. 1F and FIG. 2F, the first portion P1 and the second portion P2 are removed by using the patterned photoresist layer 114 as a mask to form a spacer S1 and a spacer S2. The spacer S1 and the spacer S2 are L-shaped. The method of removing the first portion P1 and the second portion P2 is, for example, a dry etching method. In some embodiments, since the thickness of the patterned photoresist layer 114 above the rectangular ring spacer 112a is thinner, the patterned photoresist layer 114 located above the rectangular ring spacer 112a may be removed to expose the rectangular ring spacer 112a in the process of removing the first portion P1 and the second portion P2. In this way, in the process of removing the first portion P1 and the second portion P2, a portion of the rectangular ring spacer 112a originally located under the patterned photoresist layer 114 may be simultaneously removed, so that the height of the spacer S1 and the height of the spacer S2 are lower than the height of the rectangular ring spacer 112a (referring to FIG. 2E and FIG. 2F), but the invention is not limited thereto. In other embodiments, during the process of removing the first portion P1 and the second portion P2, if the patterned photoresist layer 114 located above the rectangular ring spacer 112a is not removed, the height of the spacer S1 and the height of the spacer S2 may be approximately equal to the height of the rectangular ring spacer 112a.

The patterned photoresist layer 114 is removed. The method of removing the patterned photoresist layer 114 is, for example, dry stripping or wet stripping.

Figure 1G:
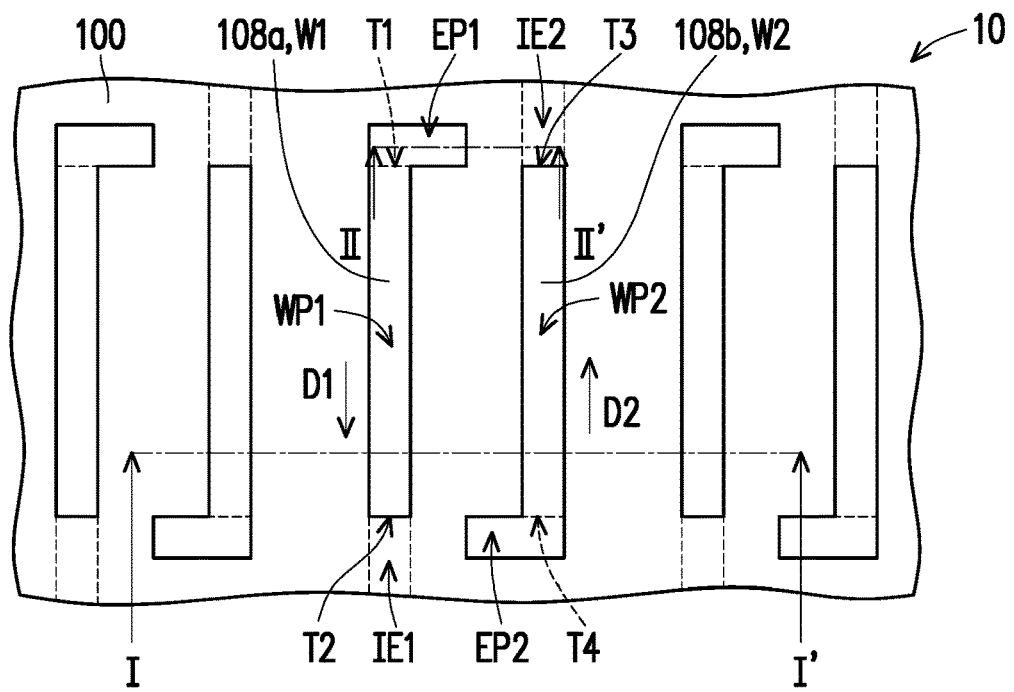
Figure 2G:
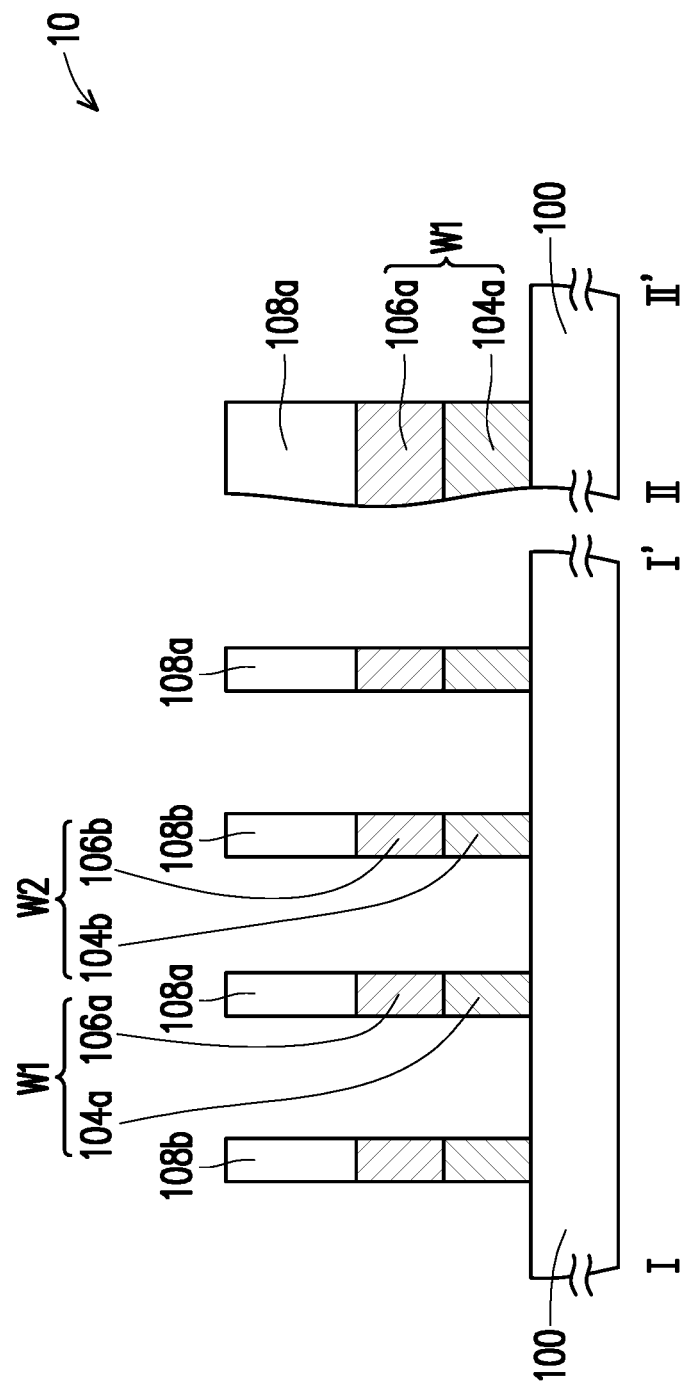

Referring to FIG. 1G and FIG. 2G, the pattern of the spacer S1 and the pattern of the spacer S2 are transferred to the hard mask layer 108 and the conductive layer 102 to form an L-shaped hard mask layer 108a, an L-shaped hard mask layer 108b, an L-shaped conductive wire W1, and an L-shaped conductive wire W2. The conductive wire W1 may include a conductive layer 104a and a conductive layer 106a. The conductive wire W2 may include a conductive layer 104b and a conductive layer 106b. The method of transferring the pattern of the spacer S1 and the pattern of the spacer S2 to the hard mask layer 108 and the conductive layer 102 is, for example, removing a portion of the hard mask layer 108 and a portion of the conductive layer 102 by using the spacer S1 and the spacer S2 as a mask. The method of removing the portion of the hard mask layer 108 and the portion of the conductive layer 102 is, for example, a dry etching method.

The spacer S1 and the spacer S2 may be removed. In some embodiments, in the process of transferring the pattern of the spacer S1 and the pattern of the spacer S2 to the hard mask layer 108 and the conductive layer 102, the spacer S1 and the spacer S2 may be gradually consumed and removed, but the invention is not limited thereto. In this case, because the hard mask layer 108a and the hard mask layer 108b are used as an etching mask, the hard mask layer 108a and the hard mask layer 108b may be partially removed, so that the height of the hard mask layer 108a and the height of the hard mask layer 108b are lower than the height of the hard mask layer 108. For example, the height of the hard mask layer 108a and the height of the hard mask layer 108b may be lower than the height of the hard mask layer 108 by 20% or less. In other embodiments, after the pattern of the spacer S1 and the pattern of the spacer S2 are transferred to the hard mask layer 108 and the conductive layer 102, if the spacer S1 and the spacer S2 are still remained, the spacer S1 and the spacer S2 may be removed by wet etching. In this case, the height of the hard mask layer 108a and the height of the hard mask layer 108b may be approximately equal to the height of the hard mask layer 108.

Figure 1H:
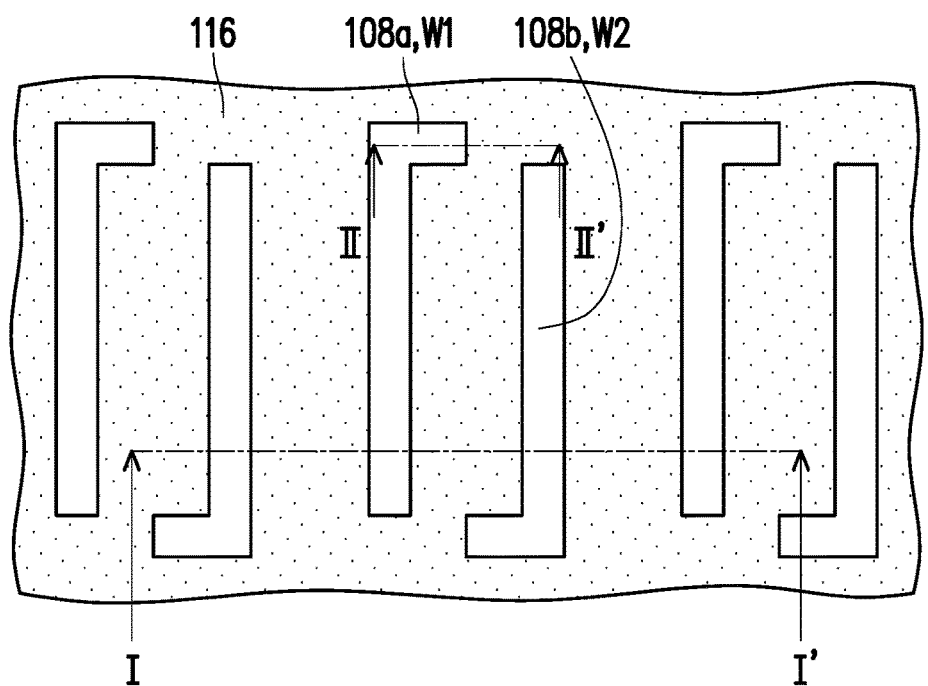
FIG. 1H to FIG. 1I are top views illustrating a manufacturing process of a contact according to an embodiment of the invention.
Figure 2H:
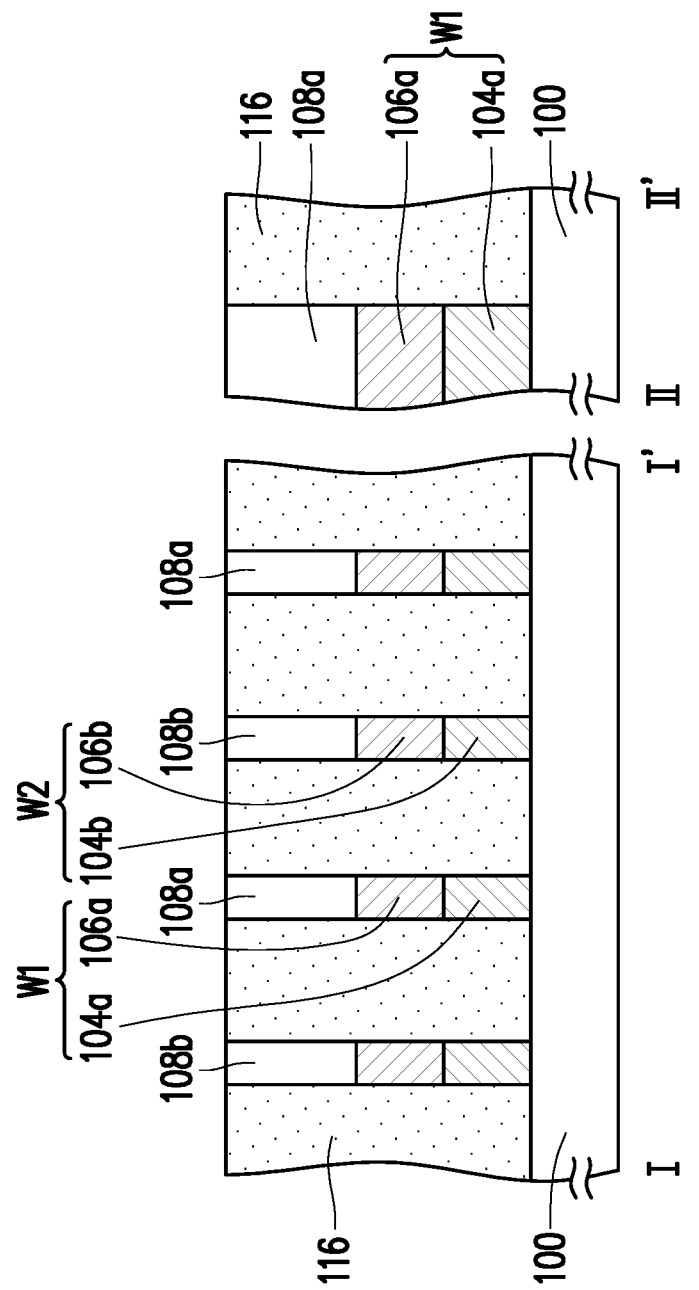

Referring to FIG. 1H and FIG. 2H, a dielectric layer 116 may be formed on the substrate 100 between the conductive wire W1 and the conductive wire W2. The material of the dielectric layer 116 is, for example, silicon oxide. The dielectric layer 116 is formed by, for example, first forming a dielectric material layer (not shown) covering the hard mask layer 108a and the hard mask layer 108b, and then performing a chemical mechanical polishing process on the dielectric material layer to expose the hard mask layer 108a and the hard mask layer 108b.

Figure 1I:
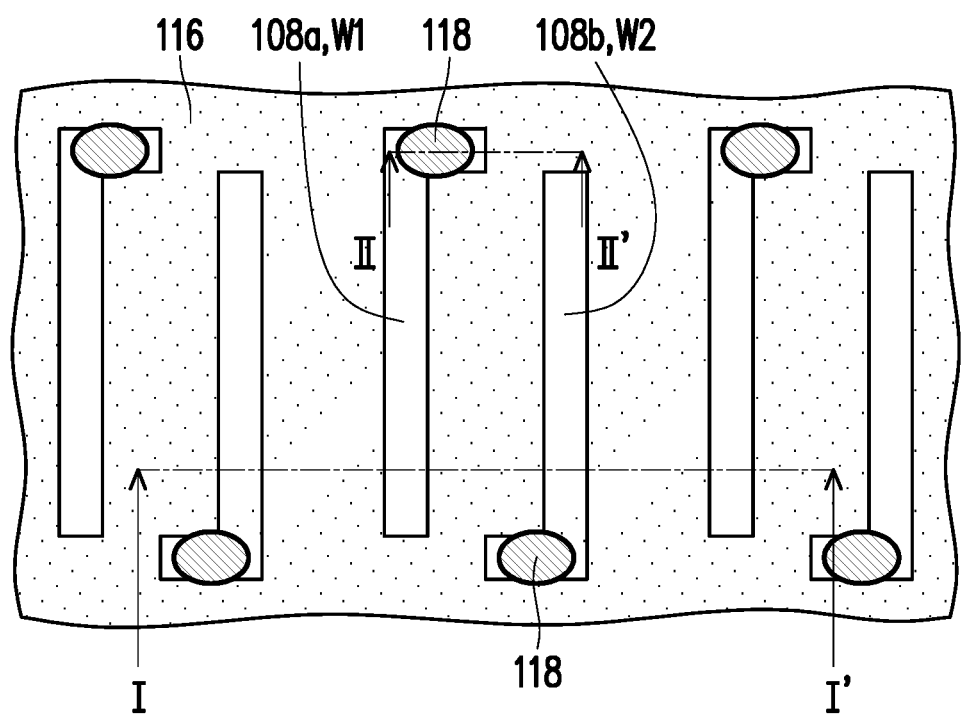
Figure 2I:
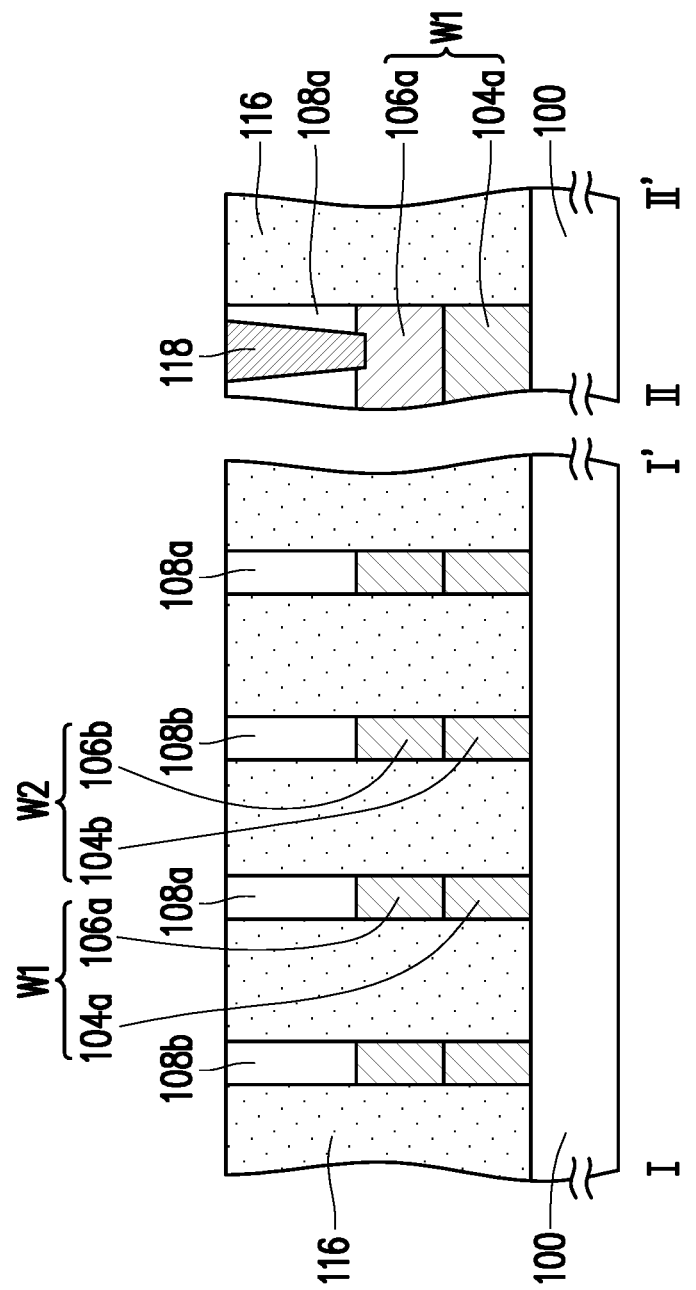

Referring to FIG. 1I and FIG. 2I, contacts 118 are formed. The contacts 118 are electrically connected to the conductive wire W1 and the conductive wire W2, respectively. The material of the contacts 118 is, for example, a metal material, such as tungsten, aluminum, or copper. The contacts 118 may be formed by an interconnect process. In some embodiments, a barrier layer (not shown) may be formed between the contact 118 and the conductive wire W1 and between the contact 118 and the conductive wire W2, respectively.

Based on the above embodiments, in the manufacturing method of the conductive wire structure 10 (referring to FIG. 1G and FIG. 2G), the L-shaped conductive wire W1 and the L-shaped conductive wire W2 are formed by the self-aligned double patterning process, the patterning process, and the pattern transfer process, so that the process can be effectively simplified to reduce the complexity of the process. In addition, the L-shaped conductive wire W1 and the L-shaped conductive wire W2 manufactured by the above method can increase the area for electrically connecting with the subsequently formed contacts 118, so that the alignment margin between the contact 118 and the conductive wire W1 and the alignment margin between the contact 118 and the conductive wire W2 can be effectively increased. Furthermore, the distance between the conductive wire W1 and the conductive wire W2 can be flexibly adjusted by the above method, thereby preventing the problem of short circuit caused by the contact 118 being simultaneously connected to the conductive wire W1 and the conductive wire W2.

Hereinafter, the conductive wire structure 10 of the present embodiment is described with reference to FIG. 1G and FIG. 2G. In the present embodiment, although the method of forming the conductive wire structure 10 is described by taking the above method as an example, the invention is not limited thereto.

Referring to FIG. 1G and FIG. 2G, the conductive wire structure 10 includes the conductive wire W1 and the conductive wire W2. In the present embodiment, the conductive wire structure 10 is exemplified by including multiple pairs of the conductive wire W1 and the conductive wire W2, but the invention is not limited thereto. As long as the conductive wire structure 10 includes at least one pair of the conductive wire W1 and the conductive wire W2, it falls within the scope of the invention. The conductive wire W2 is located on one side of the conductive wire W1. The shapes of the conductive wire W1 and the conductive wire W2 may be L-shapes. The conductive wire W1 and the conductive wire W2 may be a single-layer structure or a multi-layer structure. The conductive wire W1 may include a conductive layer 104a and a conductive layer 106a. The conductive wire W2 may include a conductive layer 104b and a conductive layer 106b.

The conductive wire W1 includes a conductive wire portion WP1 and a pad portion EP1. The conductive wire portion WP1 extends in a first direction D1 and has a first end T1 and a second end T2. The pad portion EP1 is connected to the first end T1 of the conductive wire portion WP1. The pad portion EP1 may be perpendicular to the conductive wire portion WP1.

The conductive wire W2 includes a conductive wire portion WP2 and a pad portion EP2. The conductive wire portion WP2 extends in a second direction D2 and has a third end T3 and a fourth end T4. The third end T3 is adjacent to the first end T1, and the fourth end T4 is adjacent to the second end T2. The second direction D2 is an opposite direction of the first direction D1. The pad portion EP2 is connected to the fourth end T4 of the conductive wire portion WP2. The pad portion EP2 may be perpendicular to the conductive wire portion WP2. The pad portion EP1 may be parallel to the pad portion EP2.

An imaginary extension portion IE1 extends from the second end T2 of the conductive wire portion WP1 in the first direction D1 away from the first end T1 of the conductive wire portion WP1. An imaginary extension portion IE2 extends from the third end T3 of the conductive wire portion WP2 in the second direction D2 away from the fourth end T4 of the conductive wire portion WP2. The pad portion EP1 extends toward the imaginary extension portion IE2 but does not intersect the imaginary extension portion IE2. The pad portion EP2 extends toward the imaginary extension portion IE1 but does not intersect the imaginary extension portion IE1. The imaginary extension portion IE1 and the conductive wire portion WP1 may have the same width. The imaginary extension portion IE2 and the conductive wire portion WP2 may have the same width. In addition, the imaginary extension portion IE1 and the imaginary extension portion IE2 are imaginary components and do not actually exist. The purpose of the imaginary extension portion IE2 is to describe the arrangement relationship between the pad portion EP1 and the conductive wire W2, and the purpose of the imaginary extension portion IE1 is to describe the arrangement relationship between the pad portion EP2 and the conductive wire W1.

In addition, the material, the forming method, and the arrangement of each component of the conductive wire structure 10 have been described in detail in the aforementioned embodiments, and the description thereof are not repeated here.

Based on the above embodiments, in the conductive wire structure 10, since the conductive wire W1 and the conductive wire W2 respectively have the pad portion EP1 and the pad portion EP2, the alignment margin between the contact 118 and the conductive wire W1 and the alignment margin between the contact 118 and the conductive wire W2 can be effectively increased. In addition, since the pad portion EP1 extends toward the imaginary extension portion IE2 but does not intersect the imaginary extension portion IE2, and the pad portion EP2 extends toward the imaginary extension portion IE1 but does not intersect the imaginary extension portion IE1, the problem of short circuit caused by the contact 118 being simultaneously connected to the conductive wire W1 and the conductive wire W2 can be prevented.

In summary, the conductive wire structure and its manufacturing method of the aforementioned embodiments can increase the alignment margin between the contact and the conductive wire and can prevent the problem of short circuit between adjacent two conductive wires.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A conductive wire structure, comprising:
   a first conductive wire; and
   a second conductive wire located on one side of the first conductive wire, wherein
   the first conductive wire comprises:
      a first conductive wire portion extending in a first direction and having a first end and a second end; and
      a first pad portion connected to the first end of the first conductive wire portion, and the second conductive wire comprises:
      a second conductive wire portion extending in a second direction and having a third end and a fourth end, wherein the third end is adjacent to the first end, the fourth end is adjacent to the second end, and the second direction is an opposite direction of the first direction; and
      a second pad portion connected to the fourth end of the second conductive wire portion, wherein
      a first imaginary extension portion extends from the second end of the first conductive wire portion in the first direction away from the first end of the first conductive wire portion,
      a second imaginary extension portion extends from the third end of the second conductive wire portion in the second direction away from the fourth end of the second conductive wire portion,
      the first pad portion extends toward the second imaginary extension portion but does not intersect the second imaginary extension portion, and
      the second pad portion extends toward the first imaginary extension portion but does not intersect the first imaginary extension portion.

2. The conductive wire structure according to claim 1, wherein shapes of the first conductive wire and the second conductive wire comprise L-shapes.

3. The conductive wire structure according to claim 1, wherein the first pad portion is perpendicular to the first conductive wire portion, and the second pad portion is perpendicular to the second conductive wire portion.

4. The conductive wire structure according to claim 1, wherein the first pad portion is parallel to the second pad portion.

5. The conductive wire structure according to claim 1, wherein the first imaginary extension portion and the first conductive wire portion have the same width, and the second imaginary extension portion and the second conductive wire portion have the same width.

6. The conductive wire structure according to claim 1, comprising multiple pairs of the first conductive wire and the second conductive wire.

7. The conductive wire structure according to claim 1, further comprising:
   a dielectric layer disposed between the first conductive wire and the second conductive wire.

8. The conductive wire structure according to claim 7, wherein a material of the dielectric layer comprises silicon oxide.

9. The conductive wire structure according to claim 1, further comprising:
   contacts electrically connected to the first conductive wire and the second conductive wire, respectively.

10. The conductive wire structure according to claim 9, wherein a material of the contacts comprises tungsten, aluminum, or copper.

11. The conductive wire structure according to claim 9, wherein the contacts are located above the first pad portion and the second pad portion, respectively.

12. The conductive wire structure according to claim 1, wherein
    the first conductive wire comprises a multilayer structure comprising a first conductive layer and a second conductive layer, and
    the second conductive wire comprises a multilayer structure comprising a third conductive layer and a fourth conductive layer.

13. The conductive wire structure according to claim 12, wherein a material of the first conductive layer and the third conductive layer comprises doped polysilicon.

14. The conductive wire structure according to claim 12, wherein a material of the second conductive layer and the fourth conductive layer comprises metal or metal compound.

15. The conductive wire structure according to claim 1, further comprising:
    a first hard mask layer disposed on the first conductive wire; and
    a second hard mask layer disposed on the second conductive wire.

16. The conductive wire structure according to claim 15, wherein a material of the first hard mask layer and the second hard mask layer comprises silicon nitride or silicon oxide.

* * * * *